US011268915B2

(12) United States Patent
Nomaguchi et al.

(10) Patent No.: US 11,268,915 B2
(45) Date of Patent: Mar. 8, 2022

(54) CHARGED PARTICLE BEAM DEVICE, METHOD FOR PROCESSING SAMPLE, AND OBSERVATION METHOD

(71) Applicant: Hitachi High-Tech Corporation, Tokyo (JP)

(72) Inventors: Tsunenori Nomaguchi, Tokyo (JP); Hiromi Mise, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/053,296

(22) PCT Filed: May 15, 2018

(86) PCT No.: PCT/JP2018/018784
§ 371 (c)(1),
(2) Date: Nov. 5, 2020

(87) PCT Pub. No.: WO2019/220543
PCT Pub. Date: Nov. 21, 2019

(65) Prior Publication Data
US 2021/0190703 A1    Jun. 24, 2021

(51) Int. Cl.
*G01N 23/04* (2018.01)
*G01N 23/06* (2018.01)
(Continued)

(52) U.S. Cl.
CPC ............ *G01N 23/04* (2013.01); *G01N 23/06* (2013.01); *H01J 37/20* (2013.01); *H01J 37/244* (2013.01);
(Continued)

(58) Field of Classification Search
USPC .......................................... 250/307
See application file for complete search history.

(56) References Cited

U.S. PATENT DOCUMENTS

| 7,109,483 B2 * | 9/2006 | Nakasuji | G01N 23/225 250/307 |
| 8,148,682 B2 * | 4/2012 | Hotta | G03F 7/70466 250/307 |

(Continued)

FOREIGN PATENT DOCUMENTS

| JP | 4-282545 A | 10/1992 |
| JP | 6-36085 A | 2/1994 |

(Continued)

OTHER PUBLICATIONS

International Search Report (PCT/ISA/210) Issued in PCT Application No. PCT/JP2018/018784 dated Aug. 7, 2018 with English translation (five (5) pages).

(Continued)

*Primary Examiner* — Phillip A Johnston
(74) *Attorney, Agent, or Firm* — Crowell & Moring LLP

(57) ABSTRACT

To provide, in observation of a sample that requires a movement between various devices, a charged particle beam device, a method for processing the sample, and an observation method which facilitate the movement between the devices. The charged particle beam device that processes an observation target on the sample using a charged particle beam includes: a sample stage on which the sample is placed; an observation unit configured to observe the observation target; and a writing unit configured to write information of the observation target in a writing position of the sample.

13 Claims, 14 Drawing Sheets

(51) Int. Cl.
*H01J 37/20* (2006.01)
*H01J 37/244* (2006.01)
*H01J 37/26* (2006.01)

(52) U.S. Cl.
CPC .......... *H01J 37/26* (2013.01); *G01N 2223/04* (2013.01); *G01N 2223/40* (2013.01)

(56) References Cited

U.S. PATENT DOCUMENTS

| | | | |
|---|---|---|---|
| 8,368,017 B2* | 2/2013 | Jahnke | G01Q 30/06 250/306 |
| 8,536,526 B2* | 9/2013 | Bell | G01R 31/307 250/307 |
| 2004/0227082 A1* | 11/2004 | Adachi | H01J 37/3056 250/311 |
| 2015/0294834 A1 | 10/2015 | Routh, Jr. et al. | |
| 2016/0372302 A1 | 12/2016 | Price et al. | |
| 2017/0169989 A1 | 6/2017 | Guerrero et al. | |
| 2017/0221675 A1 | 8/2017 | Hoogenboom et al. | |
| 2018/0088306 A1 | 3/2018 | Suzuki | |
| 2019/0287759 A1* | 9/2019 | Own | H01J 37/244 |

FOREIGN PATENT DOCUMENTS

| | | |
|---|---|---|
| JP | 2001-291483 A | 10/2001 |
| JP | 2001-332205 A | 11/2001 |
| JP | 2004-164966 A | 6/2004 |
| JP | 2004-325136 A | 11/2004 |
| JP | 2006-156263 A | 6/2006 |
| JP | 2008-270073 A | 11/2008 |
| JP | 2011-76960 A | 4/2011 |
| JP | 2015-204296 A | 11/2015 |
| JP | 2017-500722 A | 1/2017 |
| JP | 2018-55924 A | 4/2018 |

OTHER PUBLICATIONS

Japanese-language Written Opinion (PCT/ISA/237) issued in PCT Application No. PCT/JP2018/018784 dated Aug. 7, 2018 (four (4) pages).
Japanese-language International Preliminary Report on Patentability (PCT/IPEA/409) with Annexes issued in PCT Application No. PCT/JP2018/018784 dated Oct. 29, 2019 (nine (9) pages).

* cited by examiner

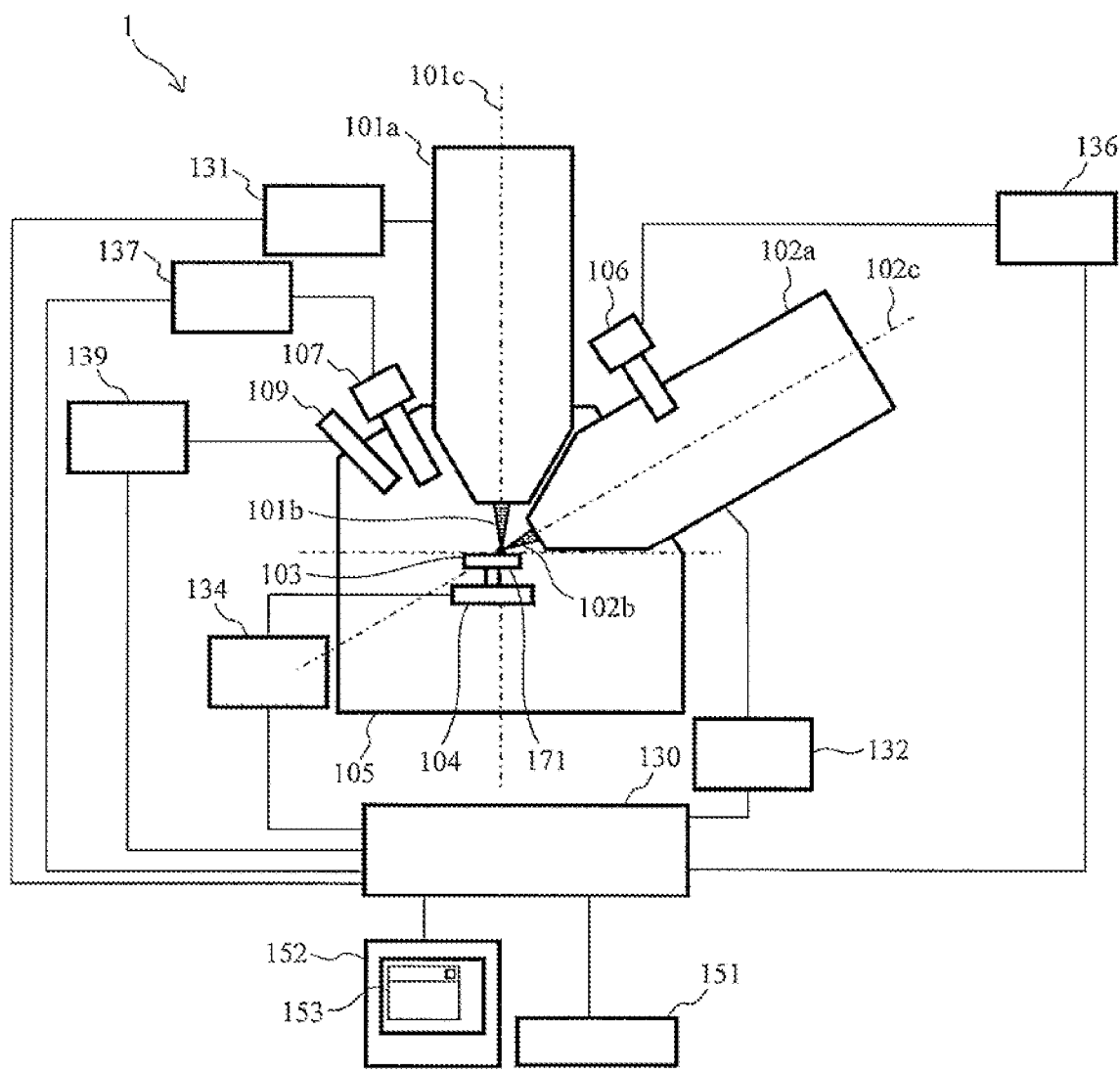
[FIG. 1]

[FIG. 2]
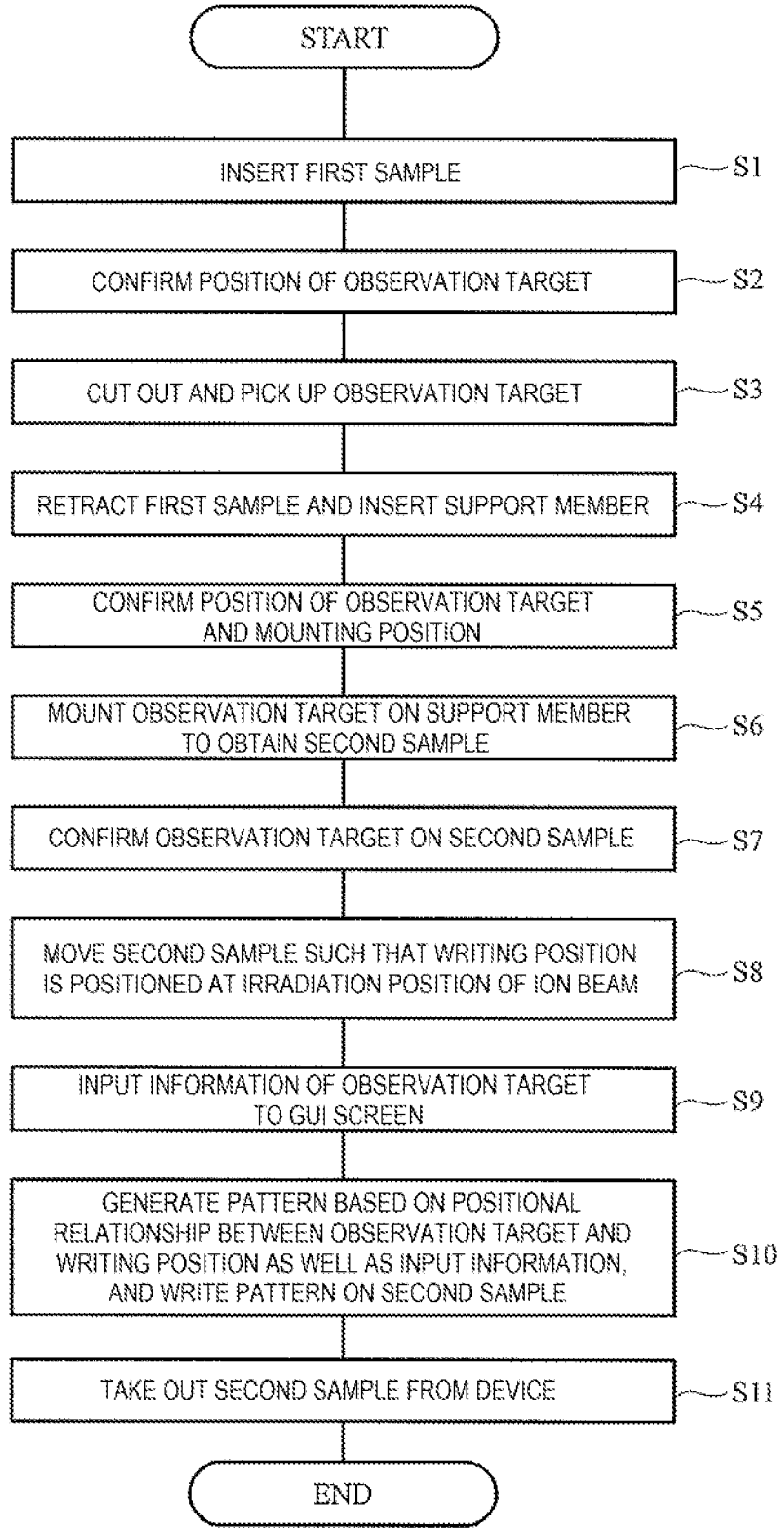

[FIG. 3A]
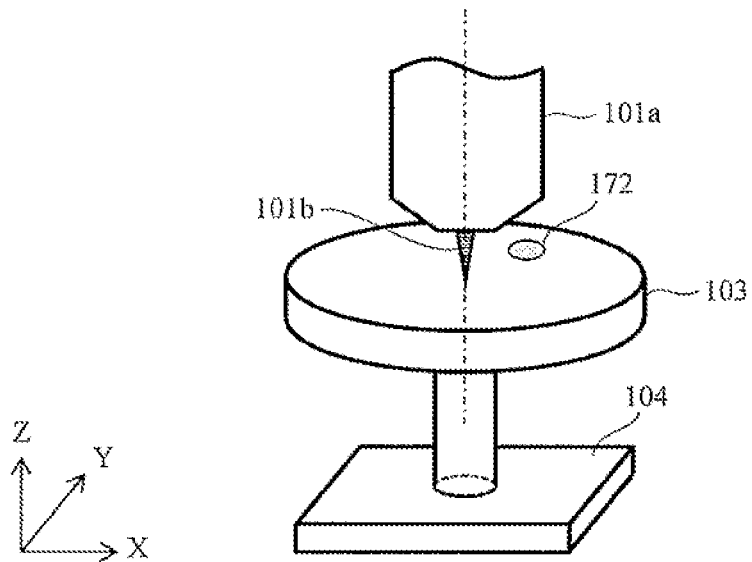
[FIG. 3B]
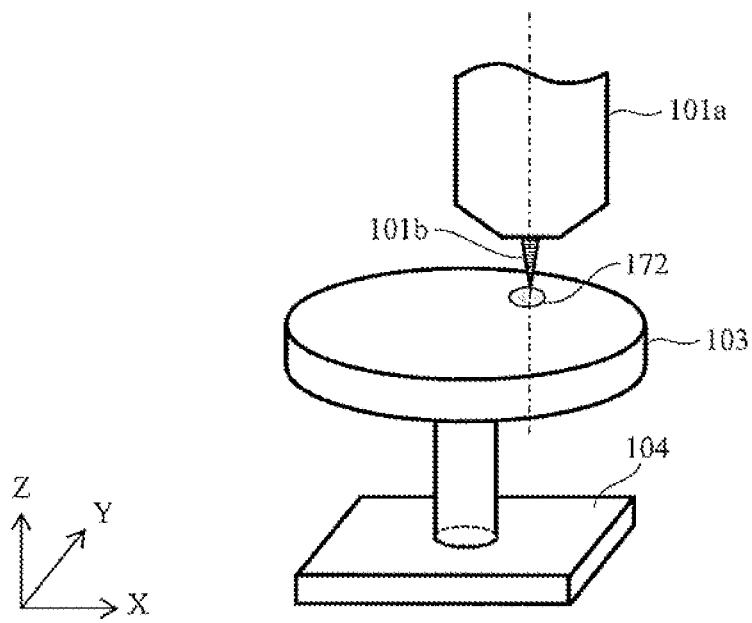

[FIG. 3C]
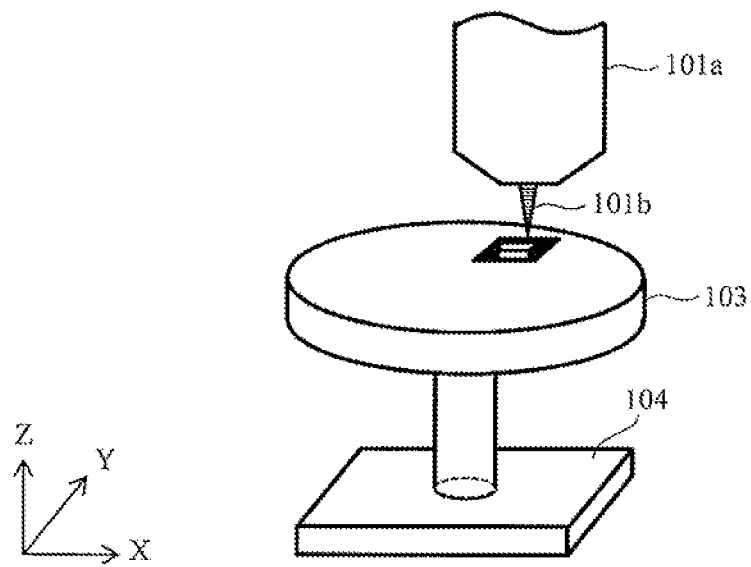
[FIG. 3D]
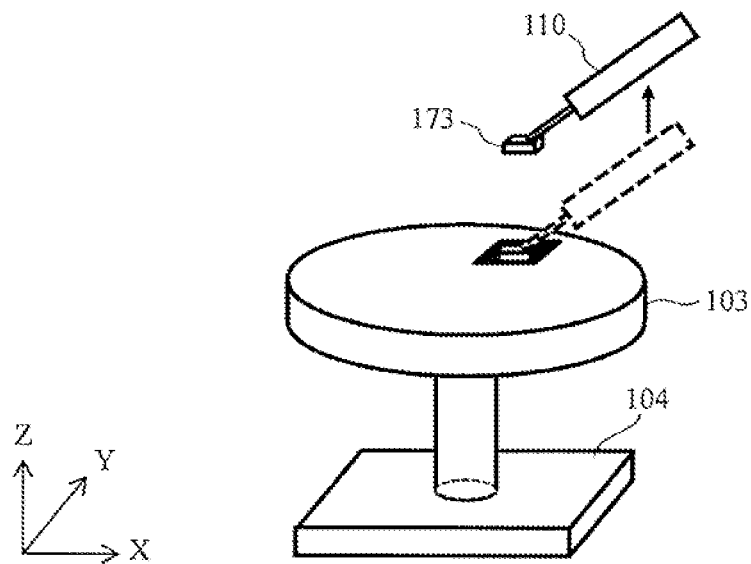

[FIG. 3E]
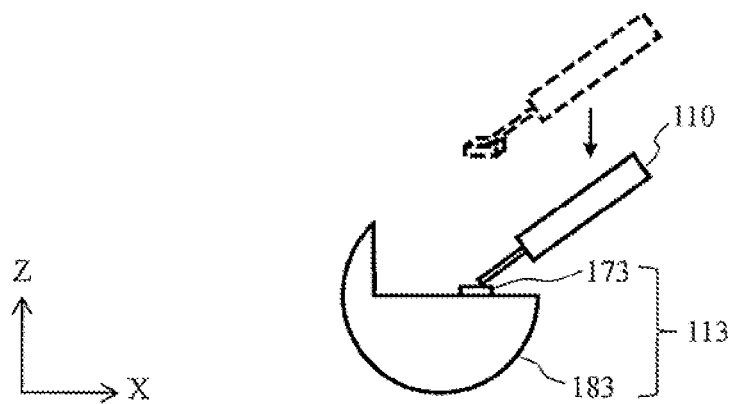
[FIG. 3F]
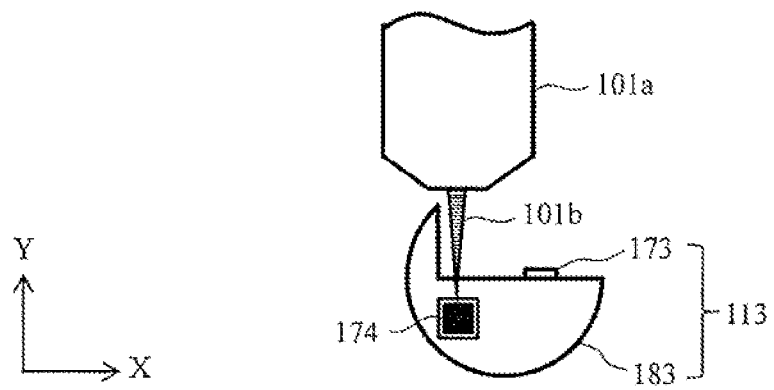
[FIG. 4A]
X:12.34  Y:56.78

[FIG. 4B]
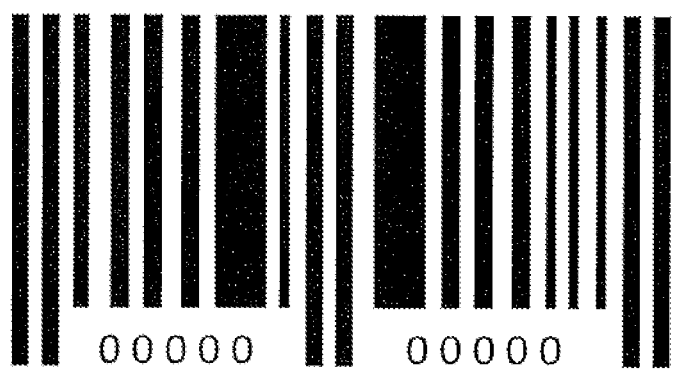
[FIG. 4C]
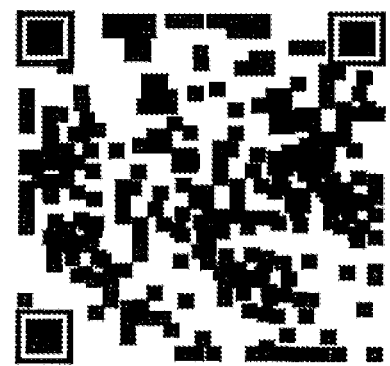

[FIG. 5]
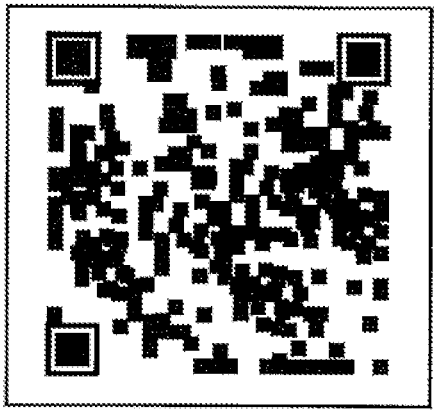

[FIG. 6]
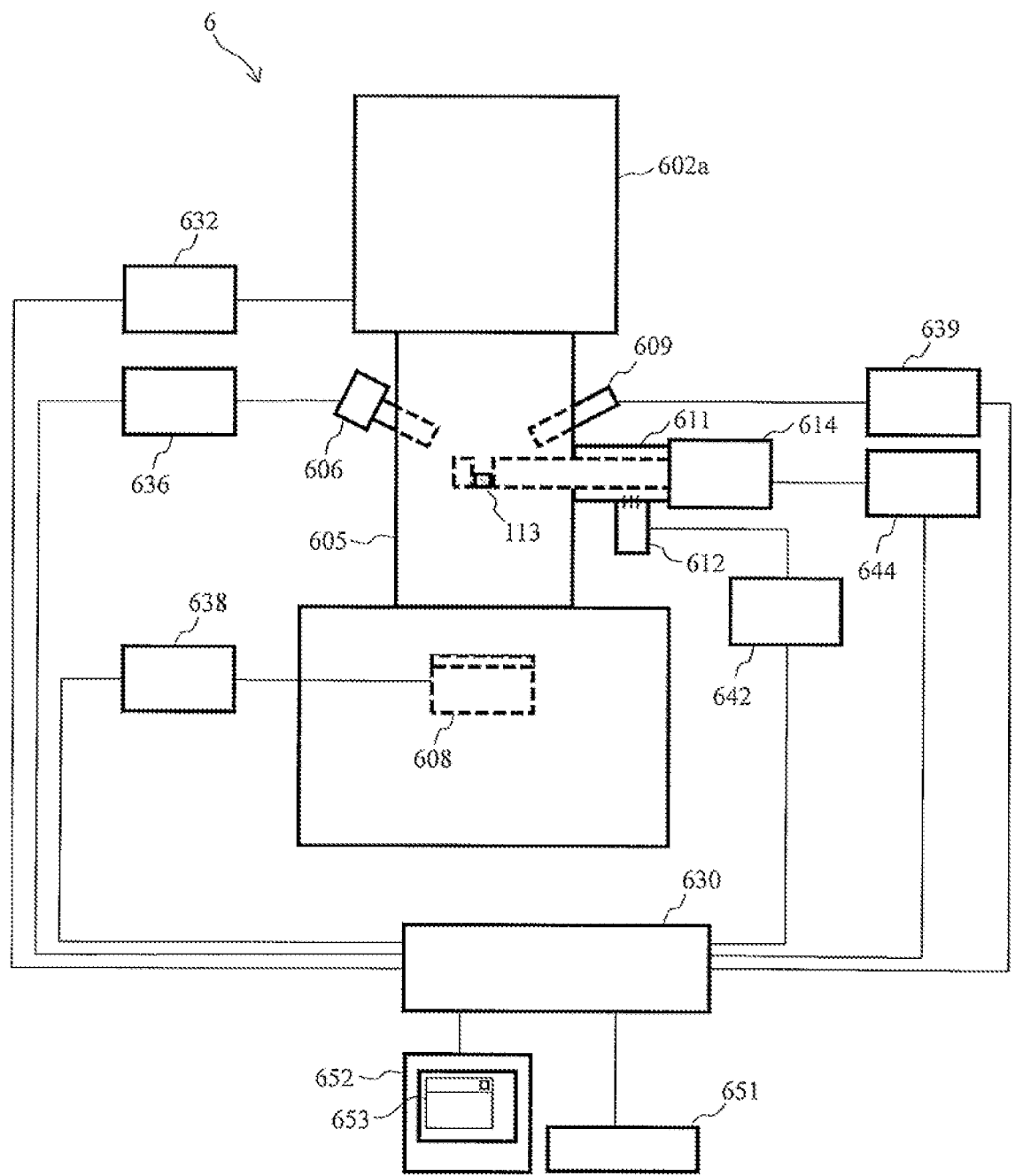

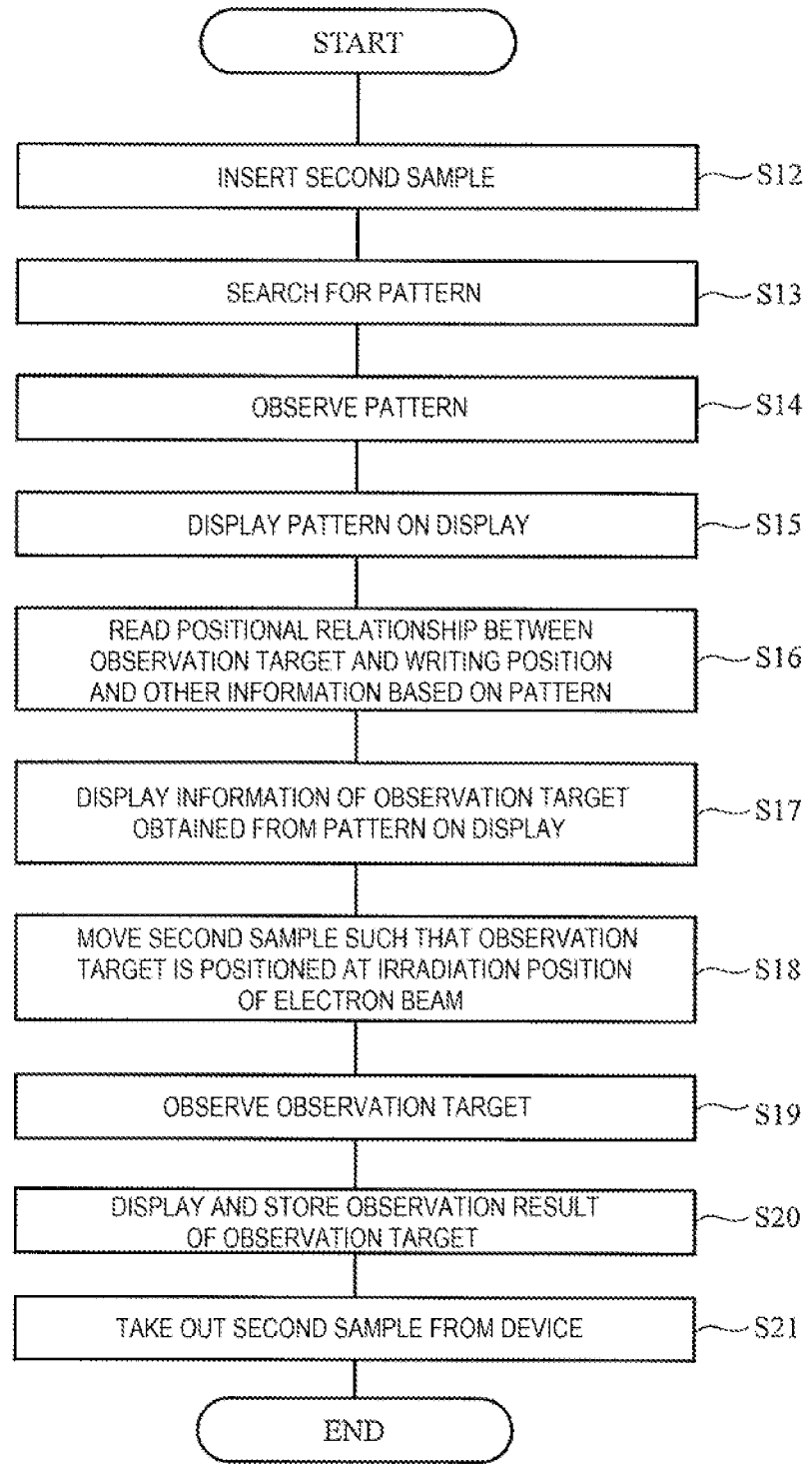

[FIG. 8]
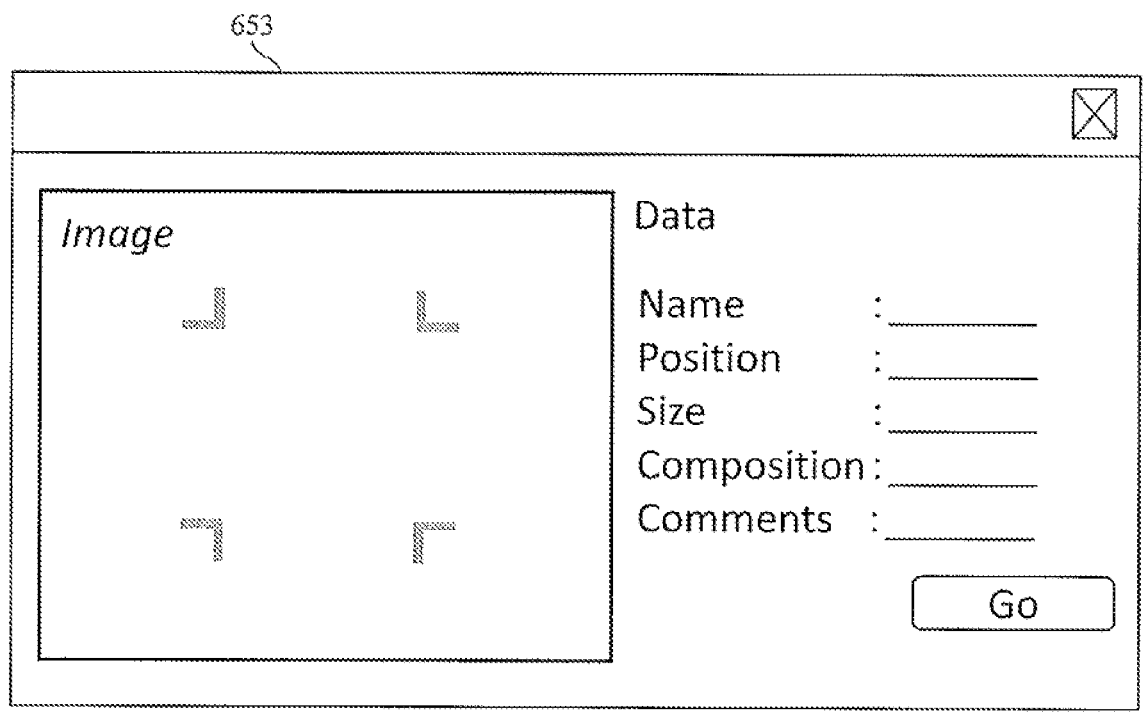

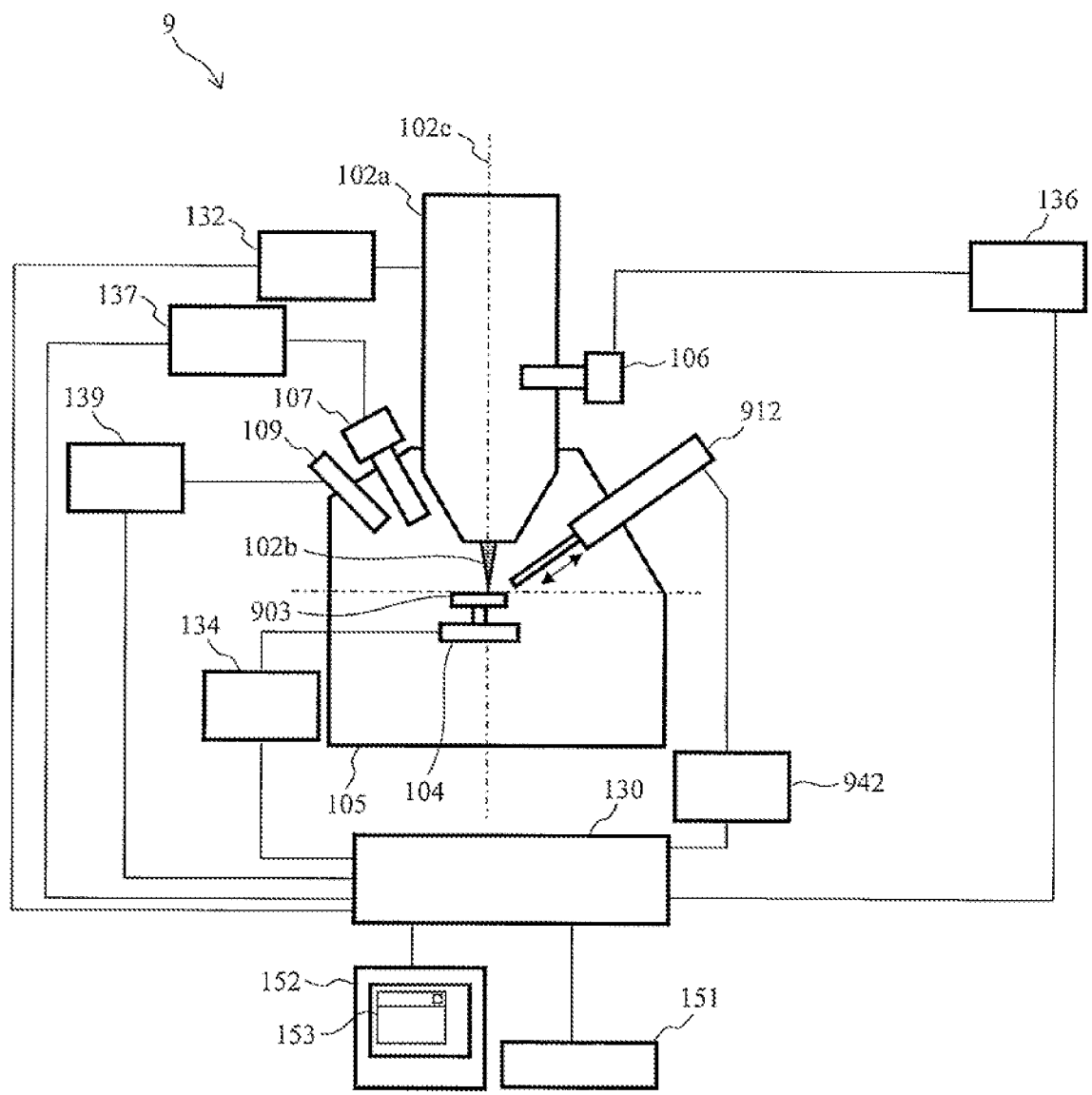
[FIG. 9]

[FIG. 10]
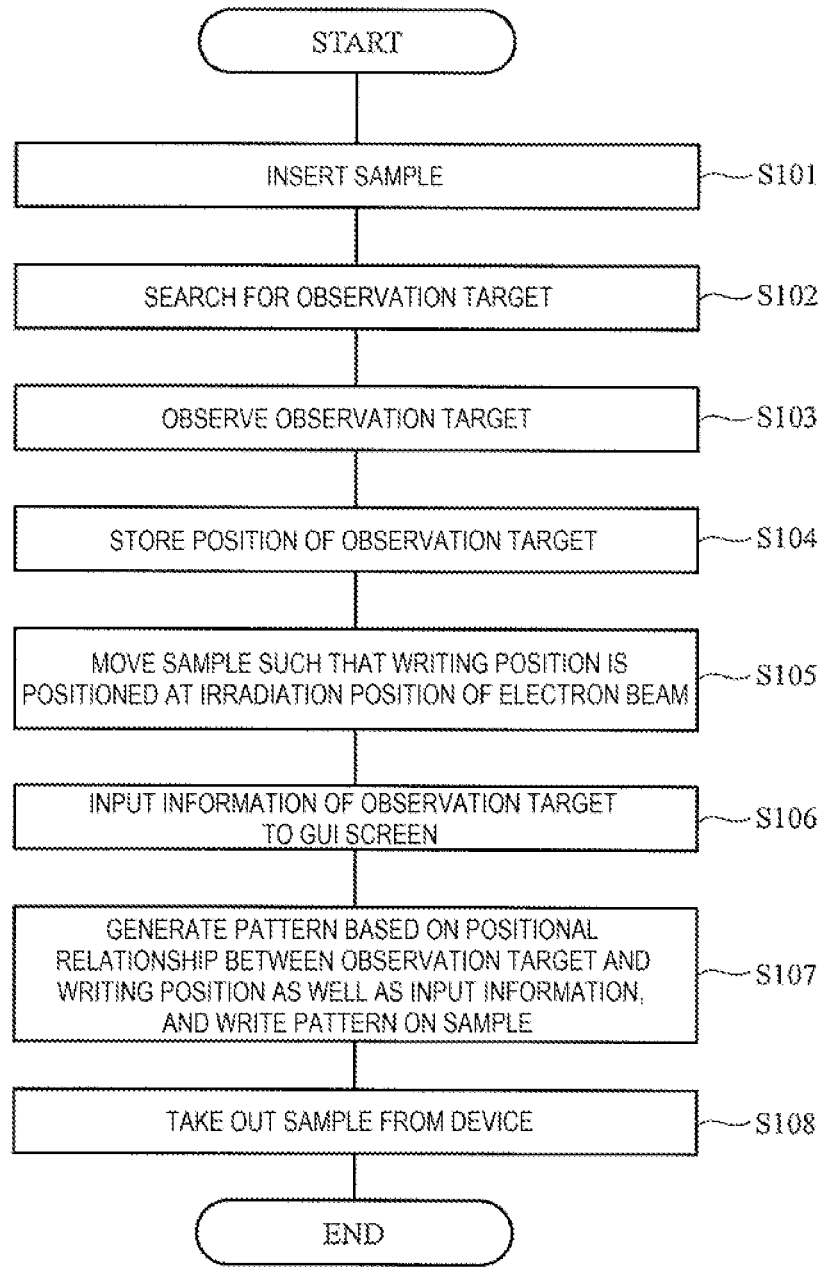

[FIG. 11A]
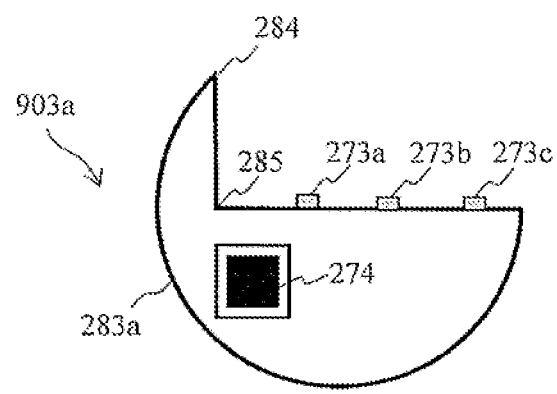
[FIG. 11B]
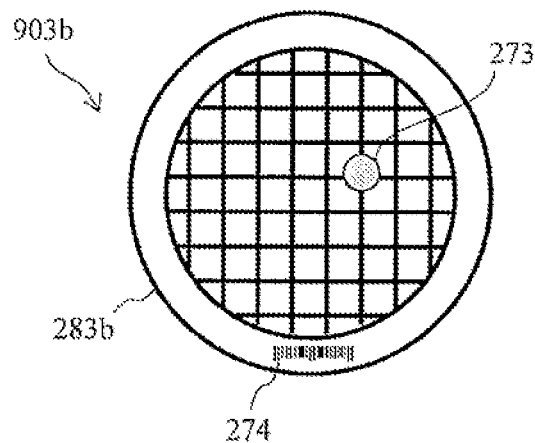

[FIG. 11C]
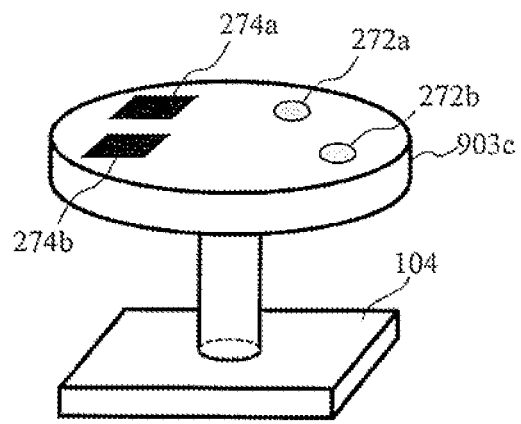
[FIG. 11D]
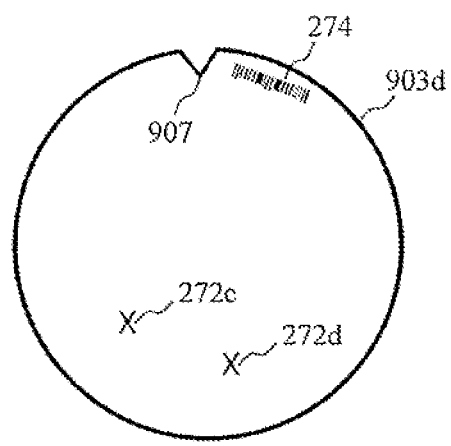

CHARGED PARTICLE BEAM DEVICE, METHOD FOR PROCESSING SAMPLE, AND OBSERVATION METHOD

TECHNICAL FIELD

The present invention relates to a charged particle beam device, a method for processing a sample, and an observation method.

BACKGROUND ART

Pretreatment of a sample to be observed with a transmission electron microscope (TEM) or a scanning transmission electron microscope (STEM) using a focused ion beam (FIB) device or an ion milling device is widely performed in various fields including a semiconductor field. At this time, it is necessary to move the sample from a device that performs the pretreatment to a device that performs the observation, and there is a demand for a method of easily sharing information of an observation target, such as position information on a position where the pretreatment is performed, between the devices. As such a technique, for example, PTL 1 discloses a method of sharing information of an observation target by preparing a sample holder that can be shared between devices, and providing a storage medium for recording the information of the observation target in the sample holder. PTL 2 discloses a sample holding device for a charged particle beam device in which a sample cartridge supporting a sample is provided with a storage medium for storing data related to the sample.

CITATION LIST

Patent Literature

PTL 1: JP-A-2006-156263
PTL 2: JP-A-2001-291483

SUMMARY OF INVENTION

Technical Problem

However, in the methods described in PTLs 1 and 2, since an information-rewritable storage medium is used, the written information of the observation target may be lost. Further, when the sample is attached to or detached from the sample holder or the sample cartridge, a mistake may occur. Further, a user is required to move or rewrite the information each time the sample is attached or detached, which is troublesome.

Therefore, the invention provides, in observation of a sample that requires a movement between a plurality of devices, a charged particle beam device, a method for processing the sample, and an observation method which facilitate the movement between the devices.

Solution to Problem

One of representative charged particle beam devices of the invention is a charged particle beam device that processes an observation target on a sample using a charged particle beam, the charged particle beam device including: a sample stage on which the sample is placed; an observation unit configured to observe the observation target; and a writing unit configured to write information of the observation target in a writing position of the sample.

Further, one of charged particle beam devices of the invention is a charged particle beam device that observes an observation target on a sample using a charged particle beam, the charged particle beam device including: a sample stage on which the sample is placed; an observation unit configured to observe the sample using the charged particle beam; and a control unit configured to read information of the observation target, in which the observation unit is configured to observe the information of the observation target written in a writing position of the sample, the control unit is configured to read a positional relationship between a position of the observation target and the writing position based on the information of the observation target, the sample stage is configured to cause the observation target to move to an irradiation position of the charged particle beam based on the positional relationship, and the observation unit is configured to observe the observation target.

One of representative methods of the invention for processing a sample is a method for processing a sample using a charged particle beam device, the method including: a step of inserting the sample into the charged particle beam device; a step of observing an observation target on the sample; and a step of writing information of the observation target in a writing position of the sample.

One of representative observation methods of the invention is an observation method for observing an observation target on a sample using a charged particle beam device, the observation method including: a step of observing information of the observation target written in the sample; a step of determining a position of the observation target based on the information of the observation target; a step of moving the sample such that the determined position of the observation target can be observed; and a step of observing the observation target.

Advantageous Effect

According to the invention, in observation of a sample that requires a movement between a plurality of devices, the movement between the devices can be facilitated.

Problems, configurations, and effects other than those described above will be clarified by the following description of embodiments.

BRIEF DESCRIPTION OF DRAWINGS

FIG. 1 is a schematic diagram showing a charged particle beam device according to a first embodiment.

FIG. 2 is a flowchart showing a method for processing a sample according to the first embodiment.

FIG. 3A is a schematic diagram showing an operation of a charged particle beam device 1 during processing of a sample.

FIG. 3B is a schematic diagram showing an operation of the charged particle beam device 1 during processing of the sample.

FIG. 3C is a schematic diagram showing an operation of the charged particle beam device 1 during processing of the sample.

FIG. 3D is a schematic diagram showing an operation of the charged particle beam device 1 during processing of the sample.

FIG. 3E is a schematic diagram showing an operation of the charged particle beam device 1 during processing of the sample.

FIG. 3F is a schematic diagram showing an operation of the charged particle beam device 1 during processing of the sample.

FIG. 4A is a schematic diagram showing an example of a pattern written on the sample.

FIG. 4B is a schematic diagram showing an example of a pattern written on the sample.

FIG. 4C is a schematic diagram showing an example of a pattern written on the sample.

FIG. 5 is a schematic diagram showing an example of a GUI screen.

FIG. 6 is a schematic diagram showing a TEM device according to the first embodiment.

FIG. 7 is a flowchart showing a sample observation method according to the first embodiment.

FIG. 8 is a schematic diagram showing an example of a GUI screen.

FIG. 9 is a schematic diagram showing a charged particle beam device according to a second embodiment.

FIG. 10 is a flowchart showing a sample observation method according to the second embodiment.

FIG. 11A is a schematic diagram showing an example of a writing position.

FIG. 11B is a schematic diagram showing an example of a writing position.

FIG. 11C is a schematic diagram showing an example of a writing position.

FIG. 11D is a schematic diagram showing an example of a writing position.

DESCRIPTION OF EMBODIMENTS

Hereinafter, embodiments of the invention will be described with reference to the drawings. The drawings are used exclusively for an understanding of the invention and do not reduce the scope of the right. Further, in the drawings, common components are denoted by the same reference numerals.

(1) First Embodiment

<Example of Configuration of Charged Particle Beam Device for Processing Sample>

A configuration of a charged particle beam device 1 according to a first embodiment will be described with reference to FIG. 1. FIG. 1 is a schematic diagram showing the charged particle beam device 1 according to the present embodiment.

As shown in FIG. 1, the charged particle beam device 1 includes an ion beam column 101a (writing unit), an ion beam column controller 131, an electron beam column 102a, an electron beam column controller 132, a sample stage 104 on which the sample 103 is placed, a sample stage controller 134, a sample chamber 105, a charged particle detector 106 (observation unit), a charged particle detector 107, detector controllers 136 and 137, an X-ray detector 109, an X-ray detector controller 139, an integrated computer 130 (control unit), an input device 151, and a display 152 (display unit).

The ion beam column 101a is a system including all components necessary for an FIB device such as an ion source for generating an ion beam 101b, a lens for focusing the ion beam 101b, and a deflection system for scanning with and shifting the ion beam 101b. Although gallium ions are generally used as the ion beam 101b, a type of ion can be appropriately changed according to the purpose of processing or observation. Further, the ion beam 101b is not limited to a focused ion beam, and may be a broad ion beam.

The ion beam column controller 131 controls the ion beam column 101a. For example, the ion beam column controller 131 controls the generation of the ion beam 101b by the ion source of the ion beam column 101a, driving of the deflection system, and the like.

The electron beam column 102a is a system including all components necessary for an SEM device such as an electron source for generating an electron beam 102b, a lens for focusing the electron beam 102b, and a deflection system for scanning with and shifting the electron beam 102b.

The electron beam column controller 132 controls the electron beam column 102a. For example, the electron beam column controller 132 controls the generation of the electron beam 102b by the electron source of the electron beam column 102a, driving of the deflection system, and the like.

The ion beam 101b that passes through the ion beam column 101a and the electron beam 102b that passes through the electron beam column 102a are mainly focused on a cross point 171 which is an intersection of an optical axis 101c of the ion beam column and an optical axis 102c of the electron beam column.

In the present embodiment, as shown in FIG. 1, the ion beam column 101a is vertically disposed and the electron beam column 102a is obliquely disposed, but the invention is not limited to the above, the ion beam column 101a may be obliquely disposed and the electron beam column 102a may be vertically disposed. Further, both the ion beam column 101a and the electron beam column 102a may be obliquely disposed. Instead of the ion beam column 101a and the electron beam column 102a, a triple column configuration including a gallium focused ion beam column, an argon focused ion beam column, and an electron beam column may be used. Further, the charged particle beam device 1 may include only the ion beam column 101a, or may include only the electron beam column 102a. That is, the sample 103 can be processed and observed by only the ion beam column 101a or only the electron beam column 102a. Further, the electron beam column 102a is not limited to the SEM device, and may be a TEM device or an STEM device that performs observation using electrons transmitted through the sample.

The sample stage 104 is provided in the sample chamber 105 at a position where the sample 103 can be irradiated with the ion beam 101b and the electron beam 102b. Driving of the sample stage 104 is controlled by the sample stage controller 134, and the sample stage 104 can be moved in a plane, vertically, or rotationally. By driving the sample stage 104, a position and an orientation of the sample 103 can be changed. The sample stage 104 is moved such that a desired position on the sample 103 is positioned at an irradiation position of the ion beam 101b or an irradiation position of the electron beam 102b, for example.

The charged particle detector 106 detects charged particles generated when the sample 103 is irradiated with the electron beam 102b. The charged particle detector 107 detects charged particles generated when the sample 103 is irradiated with the ion beam 101b. A composite charged particle detector capable of detecting not only electrons but also ions may be used as the charged particle detectors 106 and 107.

The detector controller 136 controls the charged particle detector 106. The detector controller 137 controls the charged particle detector 107. The detector controllers 136 and 137 include a circuit or an arithmetic processing unit (not shown) that arithmetically processes and images a detection signal from the charged particle detectors 106 and 107, respectively.

The X-ray detector 109 detects X-rays emitted by the sample 103. A mass spectrometer or the like may be mounted instead of the X-ray detector 109.

The X-ray detector controller 139 controls the X-ray detector 109. The X-ray detector controller 139 includes a circuit or an arithmetic processing unit (not shown) that arithmetically processes and images a detection signal from the X-ray detector 109.

The integrated computer 130 can communicate with each of the ion beam column controller 131, the electron beam column controller 132, the sample stage controller 134, the detector controllers 136 and 137, and the X-ray detector controller 139, and controls an operation of the entire charged particle beam device 1. The integrated computer 130 controls each of the above controllers according to a user instruction from the input device 151 or according to a preset condition, and causes the controllers to write a pattern on the sample 103, read information of an observation target based on the pattern, observe the observation target, and the like. Further, the integrated computer 130 includes a storage unit (not shown) for storing information and the like received from each controller of the charged particle beam device 1.

The input device 151 is a device for the user to input various instructions such as input of the information of the observation target, a change in an irradiation condition of the ion beam 101b or the electron beam 102b, and a change in a position of the sample stage 104. For example, a keyboard, a mouse, or the like can be used as the input device.

The display 152 displays a GUI screen 153 and the like. The GUI screen 153 is a screen for controlling each component of the charged particle beam device 1, and when various instructions are input to the GUI screen 153, the instructions are transmitted to the integrated computer 130. The display 152 can display, as the GUI screen 153, for example, a screen for inputting the information of the observation target, a screen for showing a state of each component of the charged particle beam device 1, a screen for displaying the information (including an image) of the observation target obtained by observation, an instruction screen for changing the irradiation condition of the ion beam 101b and the electron beam 102b, and an instruction screen for changing the position of the sample stage 104. One or a plurality of displays 152 may be provided.

In addition to the above, a gas deposition unit (not shown) and a microprobe 110 may be mounted in the sample chamber 105. The gas deposition unit and the microprobe 110 each includes a controller that controls driving thereof.

The gas deposition unit is used for producing a protective film or marking on the sample 103, and stores deposition gas that forms a deposited film by irradiation with a charged particle beam. The deposition gas can be supplied from a tip of a nozzle as needed.

The microprobe 110 includes a probe that can move in the sample chamber 105 by a probe driving unit. The microprobe 110 picks up a specific position of the sample 103 processed or cut by the ion beam column 101a. The probe can also be used for extracting a minute sample piece formed on the sample 103 and supplying an electric potential to the sample by contacting a surface of the sample 103.

The sample chamber 105 may be equipped with a decompression device for vacuum evacuation, a cold trap, an optical microscope, and the like. Further, the sample chamber 105 may be equipped with a detector such as a tertiary electron detector or an STEM detector, a backscattered electron detector, and a low energy loss electron detector.

<Method for Processing Sample>

Next, a method for processing a sample by the charged particle beam device 1 according to the present embodiment will be described with reference to FIGS. 2 to 5. In the following, it is assumed that a TEM (or STEM) sample is processed using an FIB-SEM device in which the ion beam column 101a of the charged particle beam device 1 is the FIB device and the electron beam column 102a is the SEM device.

In the present embodiment, the first sample 103 is a sample having a position as the observation target, and is, for example, a wafer, a semiconductor material, a printed board, or the like. A second sample 113 is a TEM (or STEM) sample including an observation target 173 collected from the first sample 103 and a support member 183 of the observation target 173. The support member 183 is, for example, a cutout mesh or a mesh.

FIG. 2 is a flowchart showing the method for processing a sample according to the present embodiment. FIGS. 3A to 3F are schematic diagrams showing operations of the charged particle beam device 1 during processing of a sample according to the present embodiment. In FIG. 3, for simplification of illustration, components other than the ion beam column 101a, the sample stage 104, and the microprobe 110 of the charged particle beam device 1 are omitted in the drawing. FIGS. 4A to 4C are diagrams showing an example of a pattern written on the sample. FIG. 5 is a diagram showing an example of a GUI screen.

First, in step S1, the user inserts the first sample 103 into the sample chamber 105 of the charged particle beam device 1 and places the first sample 103 on the sample stage 104 (FIG. 3A).

In step S2, the sample stage controller 134 receives from the integrated computer 130 a position 172 which is an observation target preset or instructed by input of the user to the GUI screen 153, and moves the sample stage 104. The user uses the ion beam column 101a or the electron beam column 102a to confirm the position 172 which is the observation target on the first sample 103 (FIG. 3B). The position 172 may be randomly determined by the user in step S2, or may be a preset position. When the position 172 is preset, the user may finely adjust the position 172 by inputting the instruction from the GUI screen 153. The confirmed position 172 is transmitted to the integrated computer 130.

In step S3, the integrated computer 130 transmits the position 172 confirmed in step S2 to the ion beam column controller 131. The ion beam column controller 131 drives the ion beam column 101a to cut out the observation target 173 from the position 172 by the ion beam 101b (FIG. 3C). The integrated computer 130 transmits the position 172 to the probe driving unit, and the probe driving unit drives the microprobe 110 to pick up the observation target 173 from the position 172 (FIG. 3D).

In step S4, the user retracts the first sample 103 from the sample stage 104, and inserts the support member 183 for supporting the observation target 173 into the charged particle beam device 1. FIGS. 3A to 3F show an example in which the support member 183 is the cutout mesh. The support member 183 may be supported by the sample stage 104, or may be supported by a different sample stage.

In step S5, the user confirms a position of the observation target 173 and a mounting position of the observation target 173 on the support member 183 by the ion beam column 101a or the electron beam column 102a (FIG. 3E). At this time, the user instructs the integrated computer 130 by inputting the position of the observation target 173 and the mounting position on the support member 183 to the GUI screen 153.

In step S6, the probe driving unit receives the position of the observation target 173 and the mounting position on the support member 183 from the integrated computer 130. Then, the probe driving unit drives the microprobe 110 to mount the picked-up observation target 173 at the mounting position on the support member 183 confirmed in step S5, such that the second sample 113 is obtained (FIG. 3E). At this time, it is preferable to fix the observation target 173 to the support member 183 using fixing gas, for example. As the fixing gas, for example, phenanthrene ($C_{14}H_{10}$), hexacarbonyltungsten ($W(CO)_6$), or the like can be used.

In step S7, the user confirms whether the observation target 173 on the support member 183 is mounted at the mounting position by the ion beam column 101a or the electron beam column 102a.

In step S8, the sample stage controller 134 drives the sample stage 104 to move the second sample 113 such that a writing position 174 for writing information related to the observation target 173 is positioned at the irradiation position of the ion beam 101b. At this time, the integrated computer 130 stores a positional relationship between the position of the observation target 173 and the writing position 174. The positional relationship can be, for example, a vector indicating a moving distance and a moving direction from the observation target 173 to the writing position 174, a displacement of an X coordinate and a Y coordinate, or the like. Further, the integrated computer 130 may further store coordinates of the writing position 174.

In step S9, the user appropriately inputs information of the other observation target 173 to the GUI screen 153 shown in FIG. 5 by using the input device 151. The GUI screen 153 may include a position for inputting an identification number (name, lot number, or the like) of the observation target 173, a position, a size, a composition, a comment, a work date, and the like of the observation target 173 as the information of the observation target 173. After the user inputs the information of the observation target 173, the integrated computer 130 receives the input information of the observation target 173 by clicking a "Write" button on the GUI screen 153.

The integrated computer 130 generates, based on the positional relationship between the position of the observation target 173 and the writing position 174 stored in step S8, and the information of the observation target 173 input in step S9, a pattern to be written on the second sample 113. When the user clicks the "Write" button without inputting the information of the observation target 173, the pattern is generated based on only the positional relationship between the position of the observation target 173 and the writing position 174 stored in step S8. The pattern may be a character (FIG. 4A) or a two-dimensional pattern such as a barcode (FIG. 4B) or a QR code (registered trademark) (FIG. 4C). A shape of the written pattern can be appropriately changed according to a purpose.

In step S10, the ion beam column controller 131 receives the pattern generated by the integrated computer 130, drives the ion beam column 101a to emit the ion beam 101b, and writes the pattern at the writing position 174 (FIG. 3F). As shown in FIG. 3F, an orientation of the second sample 113 can be changed such that the pattern can be written easily, and the pattern can be written on a surface of the support member 183 that is not a placement surface of the observation target 173. The writing position of the pattern may be the placement surface of the observation target 173 on the support member 183.

A writing method of the pattern is not limited to irradiation of the ion beam 101b and can be appropriately changed. For example, a pattern can be written by a deposited film using the electron beam 102b and the gas deposition unit, pressing, laser processing, etching, or the like. Further, the written pattern may or may not penetrate the second sample 113.

In the present embodiment, the positional relationship between the observation target 173 and the writing position 174 is written. However, as will be described later with reference to FIGS. 11A to 11D, a reference position is provided separately from the writing position 174, and a positional relationship between the reference position and the observation target 173 may be written in the writing position 174. The reference position may be a characteristic shape provided in advance on the support member 183, or may be an identifiable position such as a center or an end portion of the support member 183. Further, after writing, it is also possible to form a processing mark using the FIB device, a deposited film formed by using the electron beam, or the like to set the reference position. Further, the writing position 174 also can be set as the reference position.

Finally, in step S11, the user takes out the second sample 113 from the charged particle beam device 1 and stores the second sample 113.

In the present embodiment, since it is assumed that the second sample 113 is processed by the charged particle beam device 1 (FIB-SEM device) and then moved to the TEM device for observation, the second sample 113 is taken out from the charged particle beam device 1, but the second sample 113 is not always taken out. For example, when the charged particle beam device includes a plurality of analyzers, step S11 may be a process of moving the second sample 113 from a first analysis position to a second analysis position. Further, when the charged particle beam device has a space for a plurality of samples for standby or storage, step S11 may be a process of moving the second sample 113 to a standby place or a storage place.

As described above, in the present embodiment, a case where there is one observation target 173 placed on the support member 183 is shown as an example, but there may be a plurality of observation targets 173.

<Example of Configuration of Charged Particle Beam Device for Observing Sample>

Next, a configuration of a charged particle beam device for observing a sample according to the present embodiment will be described with reference to FIG. 6. In the present embodiment, observation by a TEM device 6 will be described as an example. FIG. 6 is a schematic diagram of the TEM device 6 according to the present embodiment.

The TEM device 6 is a device for observing the second sample 113 in which the information of the observation target 173 is written by the charged particle beam device 1. As shown in FIG. 6, the TEM device 6 includes an electron beam column 602a (observation unit), an electron beam column controller 632, a TEM sample stage 614 on which the second sample 113 is placed, a TEM sample stage controller 644, a sample exchange chamber 611, charged particle detectors 606 and 608, detector controllers 636 and 638, an X-ray detector 609, an X-ray detector controller 639, a press machine 612, a press machine controller 642, an integrated computer 630 (control unit), an input device 651, and a display 652.

The electron beam column 602a is a system including all components necessary for a TEM (or STEM) device such as an electron source for generating an electron beam, a lens for focusing the electron beam, and a deflection system for scanning with and shifting the electron beam. The electron beam that passes through the electron beam column 602a is emitted to the second sample 113.

The electron beam column controller 632 controls the electron beam column 602a. Specifically, the electron beam column controller 632 controls the generation of the electron beam by the electron source of the electron beam column 602a, driving of the deflection system, and the like.

In the present embodiment, as shown in FIG. 6, the electron beam column 602a is vertically disposed, but the invention is not limited to the above, and the electron beam column 602a may be obliquely disposed.

The TEM sample stage 614 is provided in a sample chamber 605 such that the second sample 113 can be irradiated with the electron beam. Driving of the TEM sample stage 614 is controlled by the TEM sample stage controller 644, and the TEM sample stage 614 can be moved in a plane, vertically, or rotationally. By driving the TEM sample stage 614, a position and an orientation of the second sample 113 can be changed. For example, the TEM sample stage 614 moves such that a sample is positioned at an irradiation position of the electron beam.

The sample exchange chamber 611 is a place for exchanging the TEM sample inserted in the sample chamber 605.

The charged particle detectors 606 and 608 detect charged particles generated when the second sample 113 is irradiated with the electron beam. A composite charged particle detector capable of detecting not only electrons but also ions may be used as the charged particle detectors 606 and 608.

The detector controller 636 controls the charged particle detector 606. The detector controller 638 controls the charged particle detector 608. The detector controllers 636 and 638 include a circuit or an arithmetic processing unit (not shown) that arithmetically processes and images a detection signal, respectively.

A gas deposition unit, a microprobe, and the like may be mounted in the sample chamber 605 similarly to the charged particle beam device 1 shown in FIG. 1.

The X-ray detector 609 detects X-rays emitted by the second sample 113. A mass spectrometer or the like may be mounted instead of the X-ray detector 609.

The X-ray detector controller 639 controls the X-ray detector 609. The X-ray detector controller 639 includes a circuit or an arithmetic processing unit (not shown) that arithmetically processes and images a detection signal from the X-ray detector 609.

The press machine 612 is a mechanism for writing the information of the observation target 173 obtained by the observation into the second sample 113. In FIG. 6, the press machine 612 is mounted in the sample exchange chamber 611 for writing information, but the method can be changed according to a purpose of writing information.

The press machine controller 642 controls driving of the press machine 612.

The sample chamber 605 may be equipped with a decompression device for vacuum evacuation, a cold trap, an optical microscope, and the like. Further, the sample chamber 605 may be equipped with a detector such as a tertiary electron detector or an STEM detector, a backscattered electron detector, and a low energy loss electron detector.

The integrated computer 630 can communicate with each of the electron beam column controller 632, the TEM sample stage controller 644, the detector controllers 636 and 638, and the X-ray detector controller 639, and controls an operation of the entire TEM device 6. The integrated computer 630 controls each of the above controllers according to a user instruction from the input device 651 or according to a preset condition, and causes the controllers to read the information of the observation target 173, write the information of the observation target 173 to the second sample 113, observe the observation target 173, and the like. Further, the integrated computer 630 includes a storage unit (not shown) for storing information and the like received from each controller of the TEM device 6.

The input device 651 is a device for the user to input various instructions such as a change in an irradiation condition of the electron beam and a change in a position of the TEM sample stage 614. For example, a keyboard, a mouse, or the like can be used as the input device.

The display 652 displays a GUI screen 653 shown in FIG. 8. The GUI screen 653 is a screen for controlling the TEM device 6, and when various instructions are input to the GUI screen 653 by the input device 651, the instructions are transmitted to the integrated computer 630. The display 652 can display, as the GUI screen 653, for example, a screen for showing a state of each component of the TEM device 6, a screen for displaying the information (including an image) of the observation target 173 obtained by observation, a screen for inputting the information of the observation target 173 obtained by the observation, an instruction screen for changing the irradiation condition of the electron beam, and an instruction screen for changing the position of the TEM sample stage 614. One or a plurality of displays 652 may be provided.

In the present embodiment, an STEM device may be used instead of the TEM device 6.

<Sample Observation Method>

Next, a sample observation method by the TEM device 6 according to the present embodiment will be described with reference to FIGS. 7 and 8. FIG. 7 is a flowchart showing the sample observation method according to the present embodiment. FIG. 8 is a schematic diagram showing the GUI screen 653.

First, in step S12, the user inserts the second sample 113 with a pattern written thereon into the TEM device 6, and places the second sample 113 on the TEM sample stage 614.

In step S13, the user uses the electron beam column 602a to search for the pattern by observing the entire second sample 113 at a low magnification. The TEM sample stage controller 644 moves the TEM sample stage 614 such that the writing position 174 of the pattern is positioned at the irradiation position of the electron beam.

The writing position 174 of the pattern may be registered in advance. For example, the writing position 174 of the pattern can be registered in advance by the user inputting the coordinates of the writing position 174 of the pattern in step S8 of FIG. 2.

Further, the search of the pattern in step S13 may be automatically performed. When the search of the pattern is performed automatically, it is preferable that the integrated computer 130 of the charged particle beam device 1 and the integrated computer 630 of the TEM device 6 can communicate with each other. In this case, the integrated computer 630 receives the coordinates of the writing position 174 from the integrated computer 130, and transmits the coordinates to the TEM sample stage controller 644. Accordingly, the TEM sample stage controller 644 can move the TEM sample stage 614 such that the writing position 174 is positioned at the irradiation position of the electron beam.

In step S14, the electron beam column 602a irradiates the writing position 174 with the electron beam to observe the pattern written on the second sample 113. The observation may use a secondary electron detector or a transmission electron detector. Although not shown in FIG. 6, the TEM device 6 may be separately equipped with a reader such as a camera for observing the pattern. An observation method of the pattern can be appropriately changed according to a purpose.

In step S15, the display 652 displays the pattern observed in step S14 as the GUI screen 653. At this time, the user may input an instruction from the GUI screen 653 to appropriately change an observation magnification of the electron beam column 602a such that the pattern is focused.

In step S16, the integrated computer 630 reads a positional relationship between the position of the observation target 173 and the writing position 174 and other information of the observation target 173 based on the observed pattern.

In step S17, as shown in FIG. 8, the display 652 receives the read information of the observation target 173 from the integrated computer 630 and displays the information on the GUI screen 653.

In step S18, the integrated computer 630 transmits the read positional relationship between the position of the observation target 173 and the writing position 174 to the TEM sample stage controller 644. The TEM sample stage controller 644 moves the TEM sample stage 614 such that the observation target 173 is positioned at the irradiation position of the electron beam.

In step S19, the user appropriately increases the observation magnification and observes the observation target 173. The observation may be performed manually, or performed automatically by the integrated computer 630 or the like.

In step S20, the display 652 displays an observation result of the observation target 173. Further, the integrated computer 630 stores the observation result of the observation target 173 in the storage unit. When the observation result is to be stored, the observation result may be stored in association with the information read in step S16.

Finally, in step S21, the user takes out the second sample 113 from the TEM device 6, and stores or discards the second sample 113. When the second sample 113 is to be stored, information of the observation target 173 newly obtained by observation can be written on the second sample 113 by using the press machine 612 before the second sample 113 is taken out from the TEM device 6. Further, in the case where the TEM device 6 includes a space for storing the second sample 113, the second sample 113 may be moved to a storage place without being taken out from the TEM device 6.

<Technical Effect>

As described above, according to the present embodiment, a configuration in which information of an observation target is written in a sample itself is adopted. Therefore, the information of the observation target can be easily shared between devices, and a movement between the devices becomes easy. Further, since the information of the observation target is written in the sample itself, a user does not need to associate the sample with the information of the observation target. This point is a very great advantage when observation and analysis is performed in a diversified manner using a plurality of devices. If the user inputs or moves the information of the observation target each time the sample is moved between the devices, there is a possibility of mistaking the information. However, when the information of the observation target is written on the sample itself, work of the user is reduced and there is no possibility of mistaking the information. This point is also very excellent from a viewpoint of traceability.

Further, since a position of the observation target is written in the sample, even if the sample is once taken out from the device, the sample can be moved such that the same position can be observed as long as inserting the sample into the device again, and it is also convenient for fixed-point observation. Therefore, it is also effective, for example, when observing the sample after leaving the sample in air for a certain period of time, or when observing a change after the sample reacts in a gas atmosphere.

(2) Second Embodiment

<Example of Configuration of Charged Particle Beam Device for Observing Sample>

A configuration of a charged particle beam device 9 according to a second embodiment will be described with reference to FIG. 9. FIG. 9 is a schematic diagram showing the charged particle beam device 9 according to the second embodiment. The configuration of the charged particle beam device 9 in the present embodiment is different from that of the charged particle beam device 1 in the first embodiment in a point that a press machine 912 and a press machine controller 942 are provided instead of the ion beam column 101a and the ion beam column controller 131. Further, in the charged particle beam device 9, the electron beam column 102a is vertically disposed. The other configurations are the same as those of the charged particle beam device 1 of the first embodiment, and thus the description thereof will be omitted.

The press machine 912 is a mechanism for writing information in a sample. The press machine controller 942 controls driving of the press machine 912. Accordingly, an obtained effect is the same as that of the first embodiment. Further, although the press machine 912 is provided in the present embodiment, the information can be written in the sample by using a microprobe as the press machine 912.

The charged particle beam device 9 according to the present embodiment is a device for observing an observation target 273 of a sample 903 processed or observed by another charged particle beam device, or the charged particle beam device 9 in the past and writing information of the observation target 273 in the sample 903. The charged particle beam device 9 can be, for example, an SEM device, a TEM device, an STEM device, or the like.

<Sample Observation Method>

Next, a sample observation method by the charged particle beam device 9 according to the second embodiment will be described with reference to FIG. 10. FIG. 10 is a flowchart showing the sample observation method according to the present embodiment. The sample observation method according to the present embodiment is different from that of the first embodiment in a point that a position of the observation target is stored after the observation target 273 is found and observed.

First, in step S101, a user inserts the sample 903 into the charged particle beam device 9 and places the sample 903 on the sample stage 104.

In step S102, the user uses the electron beam column 102a to search for the observation target 273 on the sample 903 by observing the entire sample 903.

The search of the observation target 273 may be performed automatically. In this case, the position of the observation target 273 can be automatically specified by, for example, the integrated computer 130 receiving the position of the observation target 273 from another device that processes or observes the observation target 273. Further, the position of the observation target 273 can be automatically specified by the integrated computer 130 receiving the stored position of the observation target 273 when the observation target 273 is observed by the charged particle beam device 9 in the past.

In step S103, the sample stage controller 134 moves the sample stage 104 such that the observation target 273 is positioned at an irradiation position of an electron beam. After that, the user observes the observation target 273 using the electron beam column 102a.

In step S104, the integrated computer 130 stores the position of the observation target 273 on the sample 903. The position of the observation target 273 stored in the step may be an X coordinate and a Y coordinate, or a positional relationship with a writing position 274 or a positional relationship with a reference position of the sample 903.

In step S105, the sample stage controller 134 moves the sample stage 104 such that the writing position 274, which is a position where the information of the observation target 273 is written, is positioned at a position where writing is performed by the press machine 912.

The writing position 274 may be randomly set by the user in the step, or may be registered in advance. When the writing position 274 is registered in advance, for example, the writing position 274 may be registered as a position the same as, or different from the writing position 274 in another device where the observation target 273 is processed or observed, or the writing position 274 where a pattern is written when the observation target 273 is observed by the charged particle beam device 9 in the past.

An example of the writing position 274 in step S105 will be described with reference to FIGS. 11A to 11D. FIGS. 11A to 11D are schematic diagrams showing an example of the writing position 274. As described above, a reference position may be provided separately from the writing position 274, and a positional relationship between the reference position and the observation target may be written in the writing position 274 of the sample. The reference position may be a characteristic shape provided in advance on the sample, or may be an identifiable position such as a center or an end portion of the sample. Further, after writing, as the reference position, a processing mark using an FIB device, a deposited film using an electron beam, or the like may be formed.

FIG. 11A shows a TEM sample 903a prepared by an FIB-SEM device. The reference position for indicating the position of the observation target 273 may be a part of the writing position 274, or, as shown in FIG. 11A, may be an edge portion such as a first feature point 284 of a mesh 283a as a support member, or may be a point where two ridges intersect, such as a second feature point 285. Further, as shown in FIG. 11A, information of a plurality of observation targets 273a to 273c may be written in one writing position 274.

FIG. 11B shows a TEM sample 903b in which the observation target 273 is supported on a mesh 283b. As shown in FIG. 11B, an edge of the mesh 283b may be the writing position 274. Further, there are various kinds of meshes, and some of the meshes have numbers and the like engraved in advance. In this case, those engraved marks may be used as the reference position.

FIG. 11C shows an example of an SEM sample 903c. As shown in FIG. 11C, when one SEM sample 903c has a plurality of positions 272a and 272b which are observation targets, writing positions 274a and 274b may be provided for each of the plurality of observation targets.

FIG. 11D shows a wafer 903d. In the case of the wafer 903d, a notch 907 indicating an orientation of the wafer 903d may be the reference position. In FIG. 11D, two positions 272c and 272d of the observation targets are shown, but the position may be one, or two or more. Further, the writing position 274 is not limited to the illustrated position.

In step S106, the user appropriately inputs the information of the observation target 273 to the GUI screen 153 by using the input device 151. The input of the information of the observation target 273 in the step may be performed at any stage of steps S101 to S105. After the user inputs the information of the observation target 273, the integrated computer 130 receives the input information of the observation target 273 by clicking the "Write" button on the GUI screen 153. At this time, the integrated computer 130 generates a writing pattern based on information related to the position of the observation target 273 and the input information of the observation target 273.

In step S107, the press machine controller 942 receives the pattern generated by the integrated computer 130, and drives the press machine 912 to write the pattern on the sample 903.

Finally, in step S108, the user takes out the sample 903 from the device, and stores or discards the sample 903.

The observation method in the present embodiment can also be applied to the first embodiment.

<Technical Effect>

As described above, according to the present embodiment, since the configuration of storing the position of the observation target is adopted, even if the sample is once taken out from the device, the sample can be moved such that the same position can be observed as long as inserting the sample into the device again. Therefore, for example, it is particularly effective when performing fixed-point observation, and is also effective when observing the sample after leaving the sample in air for a certain period of time, or when observing a change after the sample reacts in a gas atmosphere.

REFERENCE SIGN LIST

101a: ion beam column
101b: ion beam
101c: optical axis of ion beam column
102a, 602a: electron beam column
102b: electron beam
102c: optical axis of electron beam column
103, 903: sample
104: sample stage
105, 605: sample chamber
106, 107, 606, 608: charged particle detector
109, 609: X-ray detector
130, 630: integrated computer
131: ion beam column controller
132, 632: electron beam column controller
134: sample stage controller
136, 137, 636, 638: detector controller
139, 639: X-ray detector controller
151, 651: input device
152, 652: display
153, 653: GUI screen
171: cross point
110: microprobe
113: second sample 172, 272, 272a to 272d: position of observation target
173, 273: observation target
174, 274, 274a, 274b: writing position
183: support member
611: sample exchange chamber
612, 912: press machine
614: TEM sample stage
644: TEM sample stage controller
642, 942: press machine controller
284: first feature point
285: second feature point
283a, 283b: mesh
903a, 903b: TEM sample
903c: SEM sample
903d: wafer
907: notch

The invention claimed is:

1. A charged particle beam device that processes a sample, the charged particle beam device comprising:
a probe configured to place an observation target cut out from the sample on a support member;
an observation unit configured to observe the observation target placed on the support member; and
a writing unit configured to write information of the observation target in a writing position of the support members;
wherein the information of the observation target includes a positional relationship between a position of the observation target and the writing position, the positional relationship including a vector indicating a moving distance and a moving direction from the observation target to the writing position.

2. The charged particle beam device according to claim 1, wherein
the writing position is a reference position of the positional relationship.

3. The charged particle beam device according to claim 1, wherein
the writing unit is configured to write the information of the observation target on the support member by a charged particle beam.

4. The charged particle beam device according to claim 1, wherein
the writing unit includes a press machine that writes on the support member.

5. The charged particle beam device according to claim 1, further comprising:
a control unit, wherein
the control unit is configured to generate a pattern to be written on the support member based on the information of the observation target, and
the information of the observation target is written as the pattern.

6. The charged particle beam device according to claim 1, further comprising:
a display unit, wherein
the display unit is configured to display the information of the observation target written in the support member.

7. A charged particle beam device that observes an observation target using a charged particle beam, the charged particle beam device comprising:
a sample stage that places a support member on which the observation target is placed;
an observation unit configured to observe the observation target using the charged particle beam; and
a control unit configured to read information of the observation target, wherein the observation unit is configured to observe the information of the observation target written in a writing position of the support member,
the control unit is configured to read a positional relationship between a position of the observation target and the writing position based on the information of the observation target,
the sample stage is configured to cause the observation target to move to an irradiation position of the charged particle beam based on the positional relationship,
the observation unit is configured to observe the observation target, and
the positional relationship includes a vector indicating a moving distance and a moving direction from the observation target to the writing position.

8. The charged particle beam device according to claim 7, wherein
the observation unit searches for, before observing the information of the observation target, the information of the observation target written in the support member at a magnification lower than when observing the information of the observation target.

9. The charged particle beam device according to claim 7, further comprising:
a display unit, wherein
the display unit is configured to display the information of the observation target observed by the observation unit.

10. A method for processing a sample using a charged particle beam device, comprising:
a step of inserting the sample into the charged particle beam device;
a step of cutting out an observation target from the sample;
a step of inserting a support member into the charged particle beam device;
a step of placing the observation target on the support member;
a step of observing the observation target placed on the support member; and
a step of writing information of the observation target in a writing position of the support member;
wherein the information of the observation target includes a positional relationship between a position of the observation target and the writing position, the positional relationship including a vector indicating a moving distance and a moving direction from the observation target to the writing position.

11. The method for processing according to claim 10, further comprising:
a step of moving the support member after the writing step.

12. An observation method for observing an observation target using a charged particle beam device, the observation method comprising:
a step of inserting a support member on which the observation target is placed into the charged particle beam device;
a step of observing information of the observation target written in a writing position of the support member;
a step of determining a position of the observation target based on the information of the observation target;
a step of moving the support member such that the determined position of the observation target is able to be observed; and
a step of observing the observation target;
wherein the information of the observation target includes a positional relationship between a position of the observation target and the writing position, the positional relationship including a vector indicating a moving distance and a moving direction from the observation target to the writing position.

13. The observation method according to claim 12, wherein
the information of the observation target includes a positional relationship between the position of the observation target and a position on the sample in which the information of the observation target is written.

* * * * *